(12) United States Patent
Dosev et al.

(10) Patent No.: US 11,649,158 B2
(45) Date of Patent: May 16, 2023

(54) PIEZOELECTRIC MEMS DEVICE WITH CANTILEVER STRUCTURES

(71) Applicant: Rosemount Aerospace Inc., Burnsville, MN (US)

(72) Inventors: Dosi Dosev, Chanhassen, MN (US); David P. Potasek, Lakeville, MN (US); Marcus Allen Childress, Farmington, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 721 days.

(21) Appl. No.: 16/517,944

(22) Filed: Jul. 22, 2019

(65) Prior Publication Data
US 2021/0024350 A1 Jan. 28, 2021

(51) Int. Cl.
*B81B 3/00* (2006.01)

(52) U.S. Cl.
CPC ...... *B81B 3/0021* (2013.01); *B81B 2203/019* (2013.01); *B81B 2203/0118* (2013.01)

(58) Field of Classification Search
CPC . B81B 7/02; B81B 3/0045; B81B 2203/0118; B81B 3/0021; H01L 41/1136
See application file for complete search history.

(56) References Cited

U.S. PATENT DOCUMENTS

| 6,092,422 | A | 7/2000 | Binnig et al. |
| 7,975,550 | B2 | 7/2011 | Lee et al. |
| 10,158,340 | B1 | 12/2018 | Wu et al. |
| 2009/0284102 | A1 | 11/2009 | Karakaya et al. |
| 2014/0340726 | A1 | 11/2014 | Gu-stoppel et al. |
| 2016/0233413 | A1 | 8/2016 | Zawada et al. |
| 2019/0121123 | A1 | 4/2019 | Kaupmann |
| 2021/0135601 | A1* | 5/2021 | Zhang ................ H01L 41/1136 |

FOREIGN PATENT DOCUMENTS

CN 109495829 A 3/2019

OTHER PUBLICATIONS

Extended European Search Report for European Patent Application No. 19212914.6, dated Jul. 15, 2020, 10 pages.

* cited by examiner

*Primary Examiner* — Changhyun Yi
(74) *Attorney, Agent, or Firm* — Kinney & Lange, P.A.

(57) ABSTRACT

A microelectromechanical systems (MEMS) device includes a MEMS device body connected to a first mooring portion and a second mooring portion. The MEMS device body further includes a first cantilever and a second cantilever and connected by a spring. The spring is in operable communication with the first cantilever and the second cantilever.

18 Claims, 8 Drawing Sheets

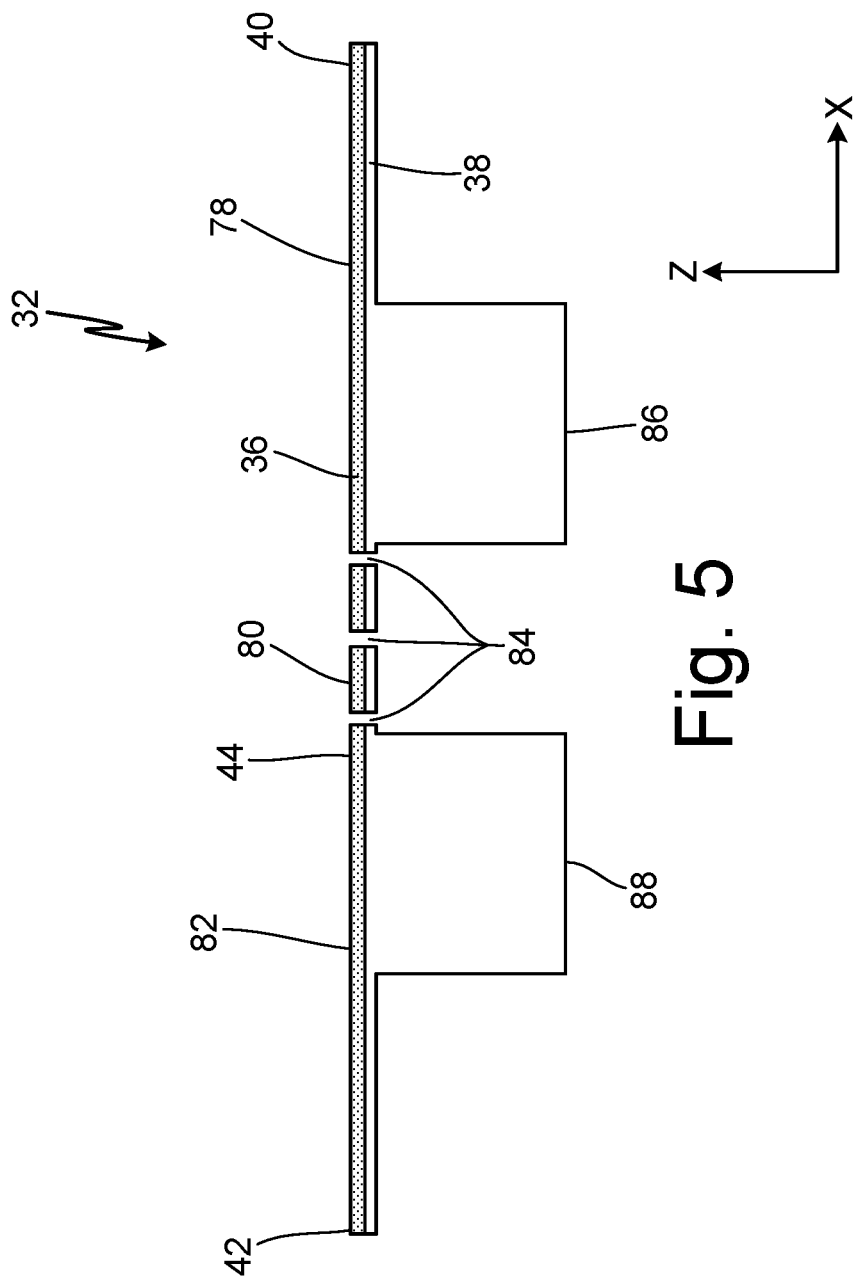

PIEZOELECTRIC MEMS DEVICE WITH CANTILEVER STRUCTURES

STATEMENT OF GOVERNMENT INTEREST

This invention was made with government support under W911QX18C0021 awarded by Defense Advanced Research Projects Agency. The government has certain rights in the invention.

BACKGROUND

The present disclosure relates to micro electromechanical systems (MEMS). More specifically, the present disclosure relates to MEMS with cantilevered structures.

MEMS cantilevers are devices constrained on one side and incorporate piezoelectric materials that can be used as sensors and actuators. Such devices can be tuned to a specific resonant frequency by using a specific mass attached to the cantilever. MEMS cantilevers can unintendedly sense secondary frequency modes that cause the cantilever to move in a twisting or rocking motion instead of the main vertical motion. Such movements in response to a secondary frequency mode are termed "parasitic sensing." Parasitic sensing can interfere with the operation of MEMS devices and cause cantilever breakage. Cantilevers tuned to lower vibration frequencies require higher proof masses and are more prone to breakage.

SUMMARY

A MEMS device includes a first layer, a second layer, a first mooring portion, a second mooring portion and a MEMS device body. The first layer is connected to the second layer. The MEMS device body is connected to the first mooring portion and the second mooring portion. The MEMS device body further comprises a first cantilever, a second cantilever, and a spring. The first cantilever is attached to the first mooring portion. The second cantilever is attached to the second mooring portion. The spring is in operable communication with the first cantilever and the second cantilever.

A transducer includes a support frame and a MEMS device. The support frame further includes a support wafer, a bonding material, a first sidewall, a second sidewall, a third sidewall, a fourth sidewall, and a cavity. The bonding material has a height H. The first sidewall attaches to the support wafer by the bonding material. The second sidewall attaches to the support wafer across from the first sidewall by the bonding material. The third sidewall attaches to the support wafer adjacent to the first sidewall and the second sidewall by the bonding material. The fourth sidewall is across from the third sidewall and adjacent to the first sidewall and the second sidewall. The fourth sidewall attaches to the support wafer by the boding material. The cavity is within the support frame and is formed by the first sidewall, the second sidewall, the third sidewall, the fourth sidewall, the bonding material, and the support wafer. The MEMS device is supported by the support frame and suspended over the cavity. The MEMS device further comprises a first layer, a second layer, a first mooring portion, a second mooring portion, and a MEMS device body. The bottom layer is connected to the first layer. The MEMS device body is attached to the first mooring portion and the second mooring portion. The MEMS device body further includes a first cantilever, a second cantilever, and a spring. The first cantilever is attached to the first mooring portion. The second cantilever is attached to the second mooring portion. The spring is in operable communication with the first cantilever and the second cantilever.

BRIEF DESCRIPTION OF THE DRAWINGS

FIG. 5 is a cross-sectional view of the MEMS device taken along line 5-5 of FIG. 4.

DETAILED DESCRIPTION

Figure 1:
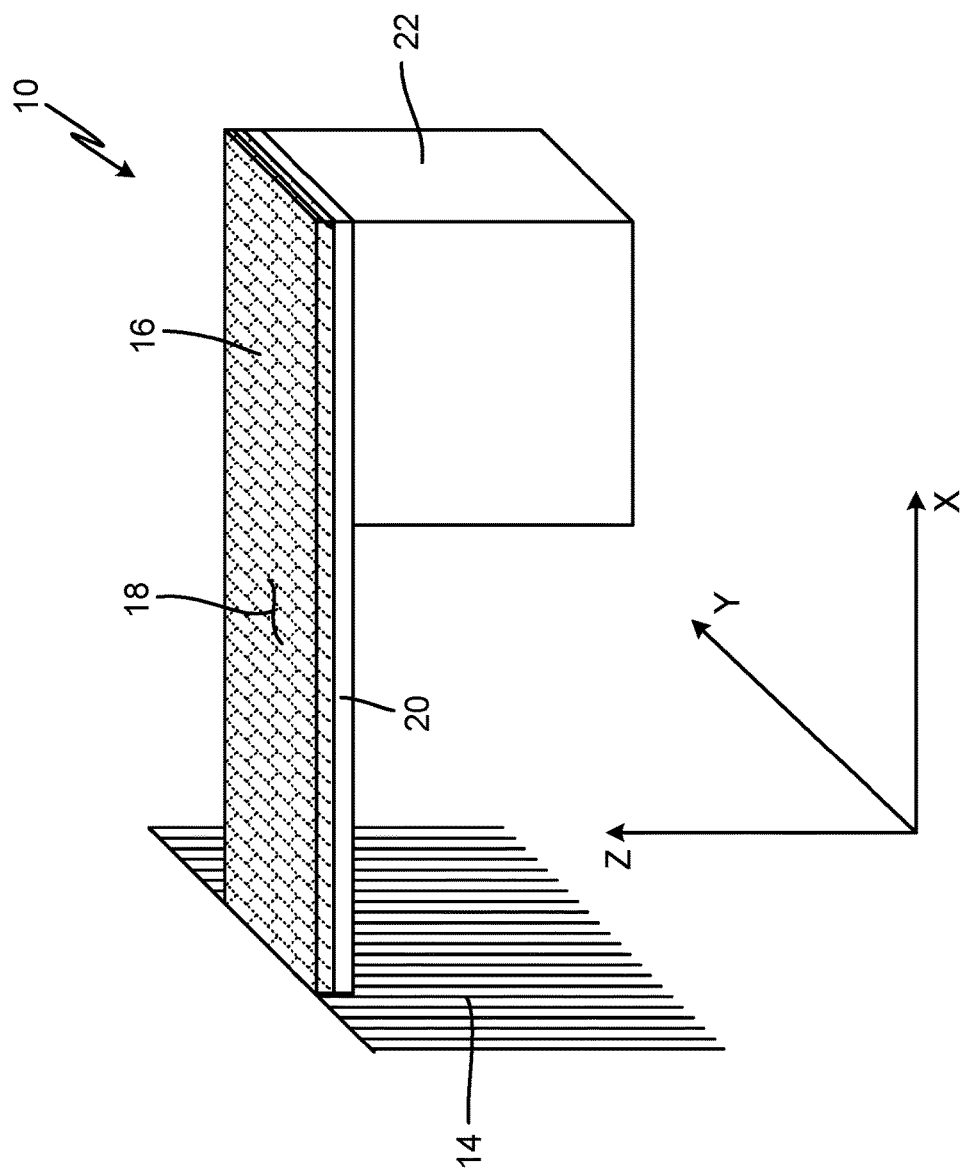
FIG. 1 is a perspective view of a prior art MEMS cantilever oriented in a plane.

FIG. 1 is a perspective view of prior art MEMS cantilever 10 oriented in x-y-z coordinates. MEMS cantilever 10 includes support structure 14, cantilever 16 with top layer 18 and bottom layer 20, and proof mass 22.

Support structure 14 is electrically and mechanically connected to one end of cantilever 16. Top layer 18 of cantilever 16 is made of a piezoelectric material such as aluminum nitride or lead zirconate titanate (PZT). Bottom layer 20 of cantilever 16 is made of substrate material, such as silicon. At the opposite end of cantilever 16 from support structure 14, bottom layer 20 of cantilever 16 connects to proof mass 22. Support structure 14 lies substantially within the y-z plane, and cantilever 16 lies substantially within the x-y plane.

MEMS cantilever 10 senses vibrations by measuring the built-up electric charge in the piezoelectric material of top layer 18 of cantilever 16 in response to vibrational movement. Proof mass 22 can have different masses to tune MEMS cantilever 10 to sense a specific vibrational resonant frequency. Alternatively or additionally, the resonant frequency of MEMS cantilever 10 can be tuned depending upon the stiffness of bottom layer 20 which is thicker and stiffer than top layer 18. Upon MEMS cantilever 10 sensing vibrational force in the z-direction at the specific resonant frequency, cantilever 16 will distort both ways along the z-axis. The mechanical movement of cantilever 16 will cause electric charge to build up in the piezoelectric material of top layer 18 of cantilever 16. Charge will be conducted along top layer 18.

MEMS cantilever 10 also responds to secondary resonance frequency modes. Such vibrations can cause parasitic sensing in cantilever 16. Forces in the y-direction will cause twisting motions in cantilever 16. Forces in the x-direction will induce a rotation moment of proof mass 22 and will cause rocking oscillation in the z-direction. This rocking oscillation will be similar to the main mode but in response to a different resonant frequency. These secondary resonant frequencies can be very close to the main frequency mode and interfere with the operation of the device. Excessive movements in the x-direction, y-direction, and z-direction can cause cantilever breakage.

Figure 2:
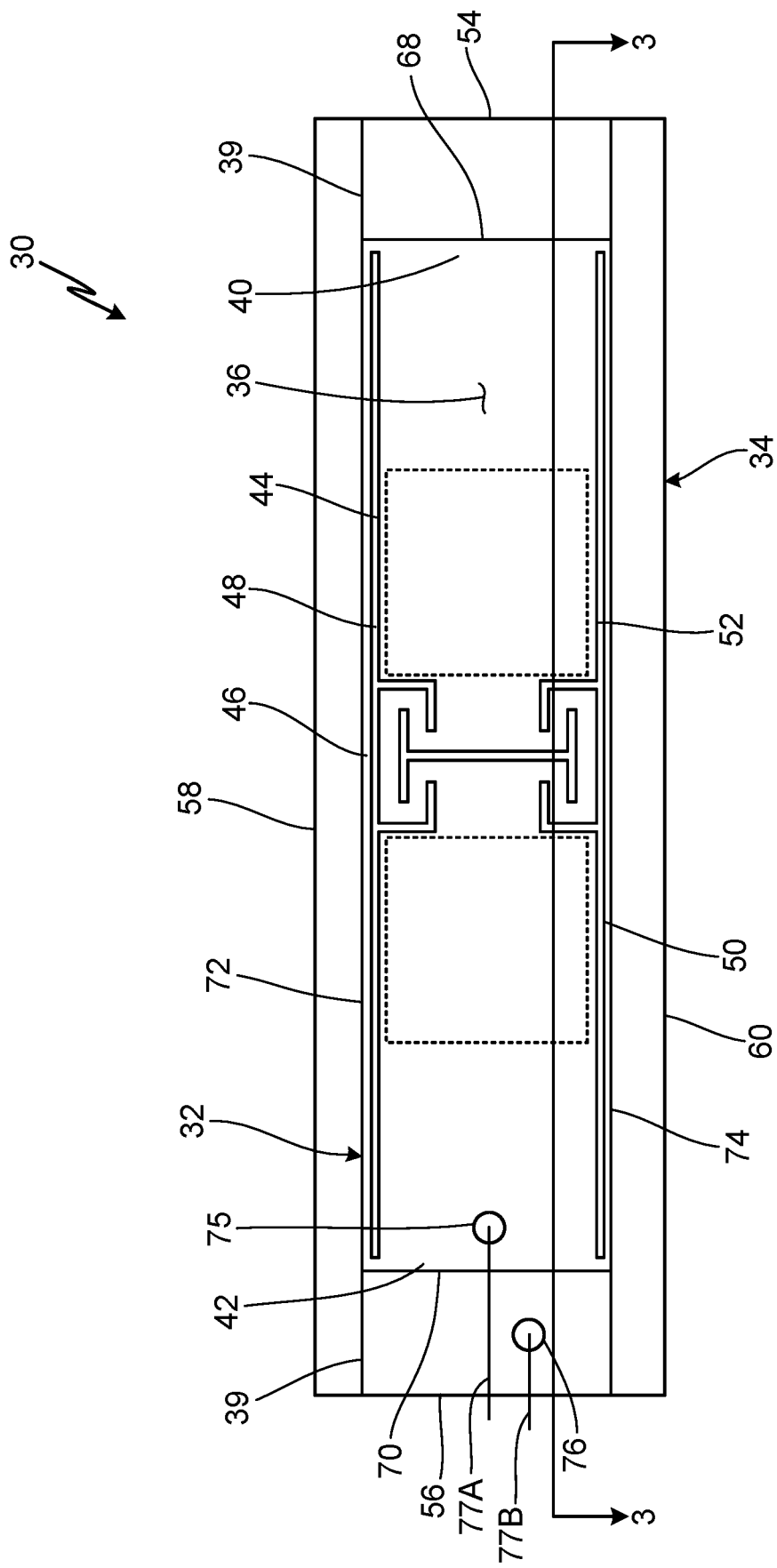
FIG. 2 is a top view of a MEMS vibrometer.
Figure 3:
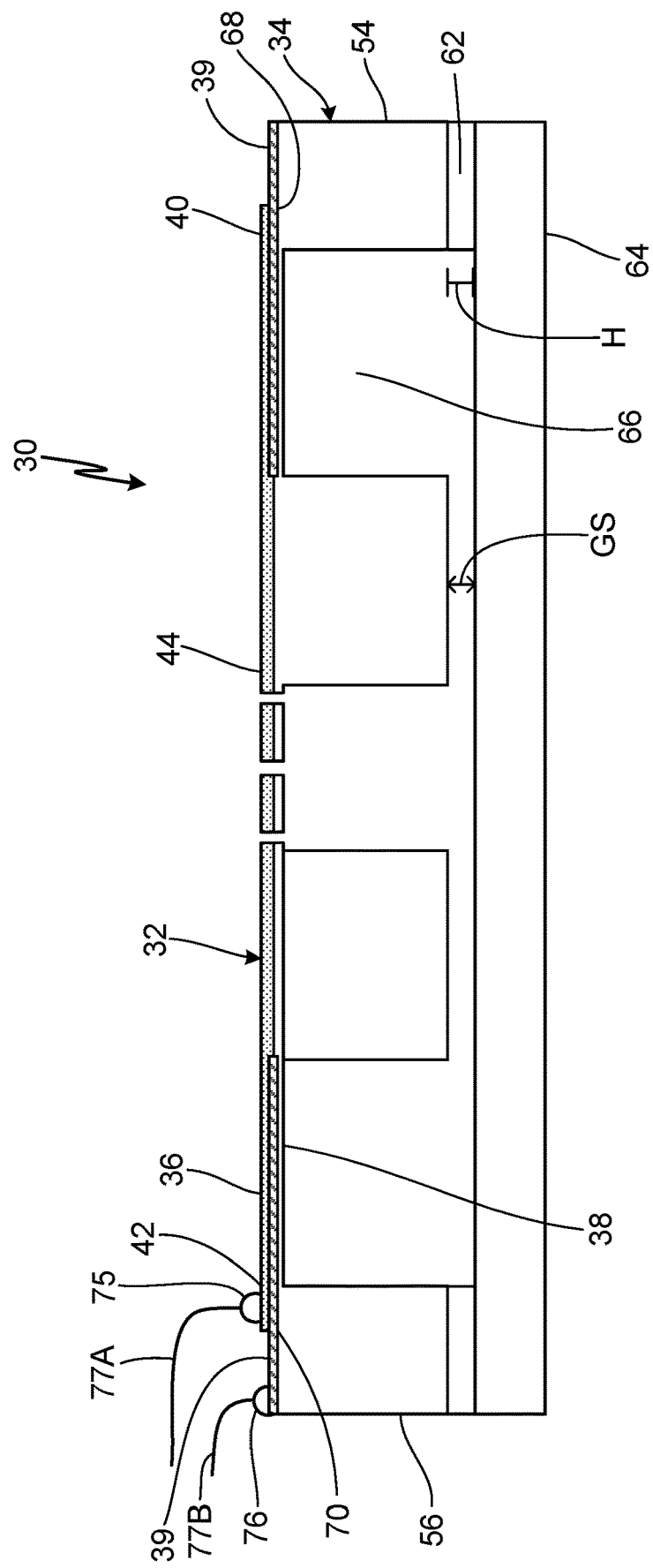
FIG. 3 is a cross-sectional view of the MEMS vibrometer taken along line 3-3 of FIG. 2.

FIG. 2 is a top view of MEMS vibrometer 30. FIG. 3 is a cross-sectional view of MEMS vibrometer 30 taken along line 3-3 of FIG. 2. FIGS. 2 and 3 will be discussed together. MEMS vibrometer 30 includes MEMS device 32 and support frame 34. MEMS device 32 includes top layer 36, bottom layer 38, electronic trace 39, first mooring portion 40, second mooring portion 42, MEMS device body 44, first margin 46, first slot 48, second margin 50, and second slot 52. Support frame 34 includes first sidewall 54, second sidewall 56, third sidewall 58, fourth sidewall 60, bonding material 62 with height H, support wafer 64, and cavity 66. Support frame 34 further includes first attachment site 68, second attachment site 70, third attachment site 72, and fourth attachment site 74. FIGS. 2-3 also show first electrode 75, second electrode 76, first connecting wire 77A, and second connecting wire 77B. FIG. 3 also shows gap space GS.

MEMS device 32 and support frame 34 are attached to form MEMS vibrometer 30. MEMS device 32 is manufactured as a single piece that includes top layer 36 and bottom layer 38. Top layer 36 is a first layer made of a piezoelectric material like aluminum nitride or PZT. Bottom layer 38 is a second layer that made of a substrate material, like surface-doped silicon. Surface-doped silicon allows bottom layer 38 to conduct the charge developed in piezoelectric top layer 36. Dopants include, but are not limited to, phosphorous or boron. Bottom layer 38 is stiffer and thicker than top layer 36. Between top layer 36 and bottom layer 38 is electronic trace 39. MEMS device 32 also includes first mooring portion 40 across from second mooring portion 42. Electronic trace 39 is located between top layer 36 and bottom layer 38 and extends past first mooring portion 40 and second mooring portion 42. MEMS device body 44 attaches on either side to first mooring portion 40 and second mooring portion 42. First margin 46 runs alongside MEMS device body 44 and attaches to first mooring portion 40 and second mooring portion 42. First slot 48 is positioned between device body 44 and first margin 46. First slot 48 extends through top layer 36 and bottom layer 38. Second margin 50 runs alongside MEMS device body 44 opposite first margin 46 and attaches to first mooring portion 40 and second mooring portion 42. Second slot 52 is positioned between MEMS device body 44 and second margin 50. Second slot 52 extends through top layer 36 and bottom layer 38 of MEMS device 32.

Support frame 34 is configured so first sidewall 54 is across from second sidewall 56. Third sidewall 58 attaches to first sidewall 54 and second sidewall 56. Fourth sidewall 60 is across from third sidewall 58 and attaches to first sidewall 54 and second sidewall 56. Bonding material 62 extends along a bottom of first sidewall 54, a bottom of second sidewall 56, a bottom of third sidewall 58, and a bottom of fourth sidewall 60. Bonding material 62 connects first sidewall 54, second sidewall 56, third sidewall 58, and fourth sidewall 60 to support wafer 64. Cavity 66 is defined by MEMS device 32, first sidewall 54, second sidewall 56, third sidewall 58, fourth sidewall 60, bonding material 62, and support wafer 64. First attachment site 68 is a top of first sidewall 54. Second attachment site 70 is a top of second sidewall 56. Third attachment site 72 is a top of third sidewall 58. Fourth attachment site 74 is a top of fourth sidewall 60. First attachment site 68, second attachment site 70, third attachment site 72, and fourth attachment site 74 are configured to attach MEMS device 32 to support frame 34.

MEMS device 32 mechanically connects to support frame 34 in four places. First mooring portion 40 of MEMS device 32 and electronic trace 39 attach to first attachment site 68 on first sidewall 54. Second mooring portion 42 of MEMS device 32 and electronic trace 39 attach to second attachment site 70 on second sidewall 56. First margin 46 attaches to third sidewall 58 at third attachment site 72. Second margin 50 attaches to fourth attachment site 74 on fourth sidewall 60. Attaching MEMS device 32 to support frame 34 creates cavity 66 within MEMS vibrometer 30. Cavity 66 provides space for MEMS device 32 to vibrate when attached to support frame 34. First electrode 75 attaches to MEMS device 32 at the piezoelectric material of top layer 36 at second mooring position 42. First connecting wire 77A attaches to first electrode 75. Second electrode 76 attaches to MEMS device 32 at electronic trace 39. Second connecting wire 77B connects to second electrode 76. Anchoring support frame 34 to support wafer 64 with bonding material 62 creates gap space GS between a bottom of MEMS device 32 and support wafer 64. Gap space GS is equivalent to height H of bonding material 62. Controlling height H of bonding material 62 limits the possible distance of travel for MEMS device 32 and reduces device breakage.

When MEMS vibrometer 30 experiences vibrational force, MEMS device 32 vibrates. Mechanical motions in MEMS device body 44 create electrical charge in the piezoelectric material of top layer 36. A top side of the piezoelectric material of top layer 36 accumulates charge opposite in sign of charge accumulated in a bottom side of the piezoelectric material of top layer 36. Charge accumulated on the top side of top layer 36 is captured by first electrode 75 attached at second mooring portion 42 and conducted along first connecting wire 77A. Charge accumulated on the bottom side of top layer 36 is conducted along bottom layer 38 to electronic trace 39, captured by second electrode 76, and conducted along second connecting wire 77B. First mooring portion 40, second mooring portion 42, first margin 46, and second margin 50 attach MEMS device 32 mechanically to support frame 34. First slot 48 and second slot 52 allow MEMS device body 44 to move freely when MEMS vibrometer 30 senses vibrations. Support frame 34 provides a robust structure for MEMS device 32 and allows MEMS vibrometer 30 to be mounted on many types of surfaces. Upon modification, MEMS vibrometer 30 could also be used as a different type of sensor or actuator device.

Figure 4:
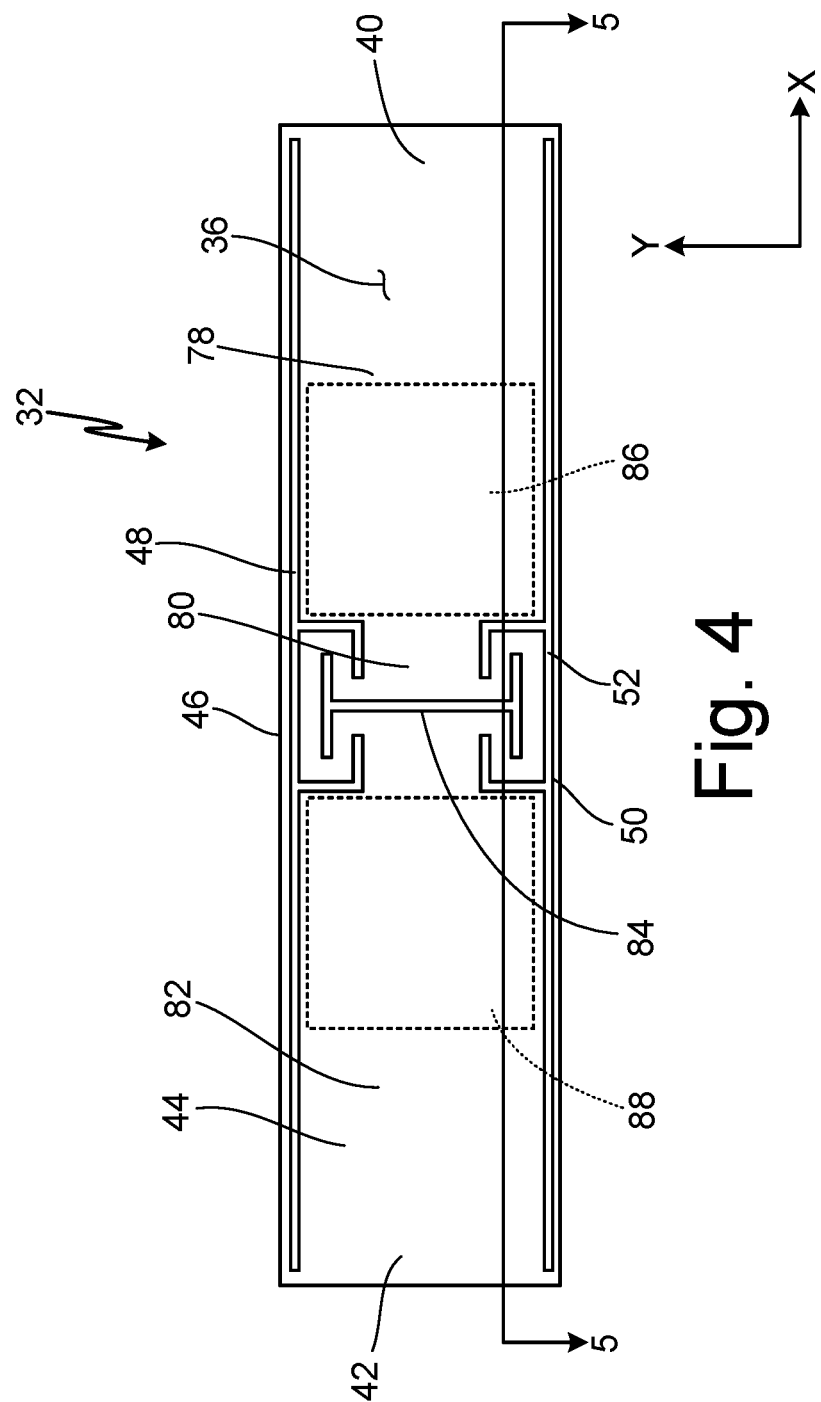
FIG. 4 is a top view of a MEMS device including a pair of cantilevers connected with a spring.

FIG. 4 is a top view of MEMS device 32 including first cantilever 78 and second cantilever 82 connected with pivot spring 80. FIG. 5 is a cross-sectional view of MEMS device 32 taken along line 5-5 of FIG. 4. FIGS. 4 and 5 will be discussed together. MEMS device 32 has top layer 36, bottom layer 38, first mooring portion 40, second mooring portion 42, MEMS device body 44, first margin 46, first slot 48, second margin 50, and second slot 52. MEMS device body 44 includes first cantilever 78, pivot spring 80, second cantilever 82, circuitous cuts 84, first proof mass 86, and second proof mass 88.

MEMS device 32 is manufactured as a single piece. Top layer 36 of MEMS device 32 is a first layer made of a piezoelectric material such as aluminum nitride or PZT. Bottom layer 38 of MEMS device 32 is a second layer made of a substrate material such as surface-doped silicon. Bottom layer 38 is stiffer and thicker than top layer 36. MEMS device 32 has first mooring portion 40 oriented across from second mooring portion 42. First margin 46 runs alongside MEMS device body 44 and attaches to first mooring portion 40 and second mooring portion 42 at either end. First slot 48 is between MEMS device body 44 and first margin 46. First slot 48 extends through top layer 36 and bottom layer 38.

Second margin 50 is alongside MEMS device body 44 opposite first margin 46. Second margin 50 attaches to first mooring portion 40 and second mooring portion 42 of MEMS device 32. Second slot 52 is between MEMS device body 44 and second margin 50. Second slot 52 extends through top layer 36 and bottom layer 38. FIG. 4 shows MEMS device 32 is oriented so first margin 46 is generally parallel to the x-axis and first mooring portion 40 is generally parallel to the y-axis. FIG. 5 shows MEMS device 32 is generally perpendicular to the z-axis.

MEMS device body 44 connects with first mooring portion 40 and second mooring portion 42 on opposite sides. MEMS device body 44 includes first cantilever 78, pivot spring 80, and second cantilever 82. First cantilever 78 connects to first mooring portion 40 of MEMS device 32 on one side and pivot spring 80 on the other. Pivot spring 80 has circuitous cuts 84 that extend through top layer 36 and bottom layer 38 of MEMS device 32. Circuitous cuts 84 can have a variety of patterns, one of which is shown in FIG. 4. Circuitous cuts 84 connect to first slot 48 and second slot 52. Second cantilever 82 connects to pivot spring 80 on the opposite side of first cantilever 78. Second cantilever 82 connects to second mooring portion 42 of MEMS device 32 opposite pivot spring 80. Pivot spring 80 is in operable communication with first cantilever 78 and second cantilever 82. First cantilever 78 and second cantilever 82 are electrically connected in parallel with the bottom layer 38 of first cantilever 78 and second cantilever 82 electrically connected and the top layer 36 of first cantilever 78 and second cantilever 82 electrically connected. First proof mass 86 attaches to a bottom of bottom layer 38 of first cantilever 78. Second proof mass 88 attaches to a bottom of bottom layer 38 of second cantilever 82. First proof mass 86 and second proof mass 88 need not be additional mass and can be equivalent to the masses of first cantilever 78 and second cantilever 82, respectively.

MEMS device 32 is tuned to respond to a specific resonant frequency dependent on first proof mass 86 and second proof mass 88. Bottom layer 38 can also tune the resonance frequency of MEMS device 32 depending on the stiffness of bottom layer 38. Upon sensing the specific resonance frequency in the z-direction, MEMS device body 44 vibrates in the z-direction with first cantilever 78 and second cantilever 82 moving in phase due to the connection through pivot spring 80. Mechanical movement of first cantilever 78 and second cantilever 82 cause electrical charge to build in the piezoelectric material of top layer 36 of MEMS device 32. A top of top layer 36 collects signed electric charge and a bottom of top layer 36 collects charge of the opposite sign. First slot 48 and second slot 52 allow MEMS device body 44 to move independently of first margin 46 and second margin 50. First margin 46 and second margin 50 can act as anchoring points for MEMS device 32.

The in-phase movements of electrically connected first cantilever 78 and second cantilever 82 allow for same-sign electrical current transmission across MEMS device 32. Symmetric, sign-specific movements of first cantilever 78 and second cantilever 82 allow for the charge created by top layer 36 of MEMS device 32 to be additive and increase the signal-to-noise ratio of MEMS device 32. Pivot spring 80 cancels opposite-sign electrical buildup at an inflection point of MEMS device body 44.

The connection of first cantilever 78 to second cantilever 82 with pivot spring 80 helps reduce parasitic sensing from vibrations other than the primary resonant frequency. First, out-of-phase oscillations of first cantilever 78 and second cantilever 82 in the z-direction will be reduced to negligibly small amplitudes and very high frequencies that are separate from the primary resonant frequency. The charge generated by such movements will be cancelled out and net sensing will be zero. Second, linking first cantilever 78 and second cantilever 82 with pivot spring 80 cancels parasitic signals created by rocking movements caused by force in the x-direction. The motion will be restricted by pivot spring 80 to negligible amplitudes and very high frequencies different than the primary resonant frequency. The charge generated by first cantilever 78 and second cantilever 82 will have opposite signs and the net result electric signal will be zero. Third, rotational movement caused by force in the y-direction is limited because pivot spring 80 will cause first cantilever 78 and second cantilever 82 to twist in phase. In-phase twisting motions will induce symmetric tensile and compressive stress in both first cantilever 78 and second cantilever 82 that will cancel. The resulting net electric charge will be zero.

Further, mechanically linking first cantilever 78 with second cantilever 82 helps limit MEMS device body 44 movement in the z-direction preventing excessive travel that can lead to breakage. Circuitous cuts 84 define the stiffness in pivot spring 80 and reduce the size that pivot spring 80 takes up.

Figure 6A:
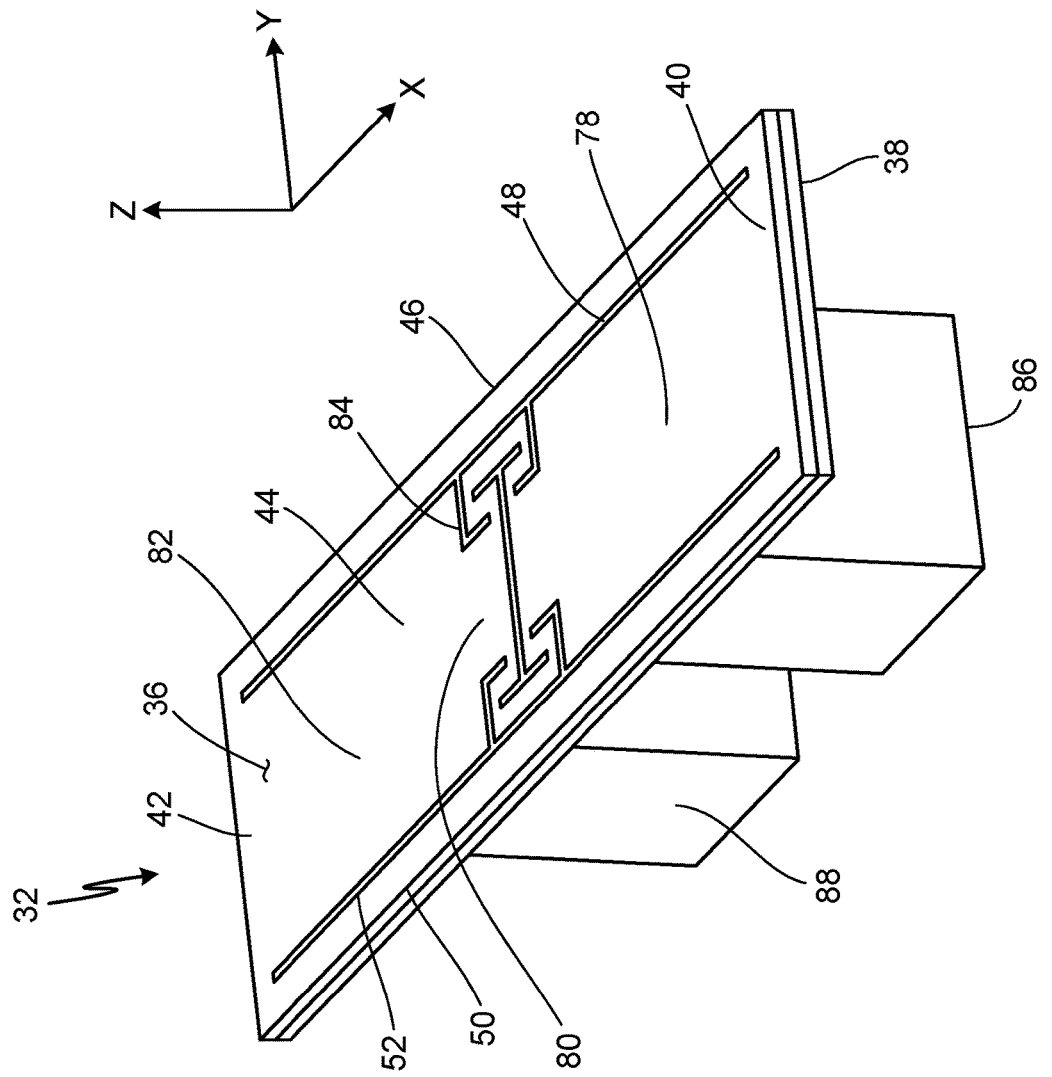
FIG. 6A is a perspective view of the MEMS device in a relaxed state.
Figure 6B:
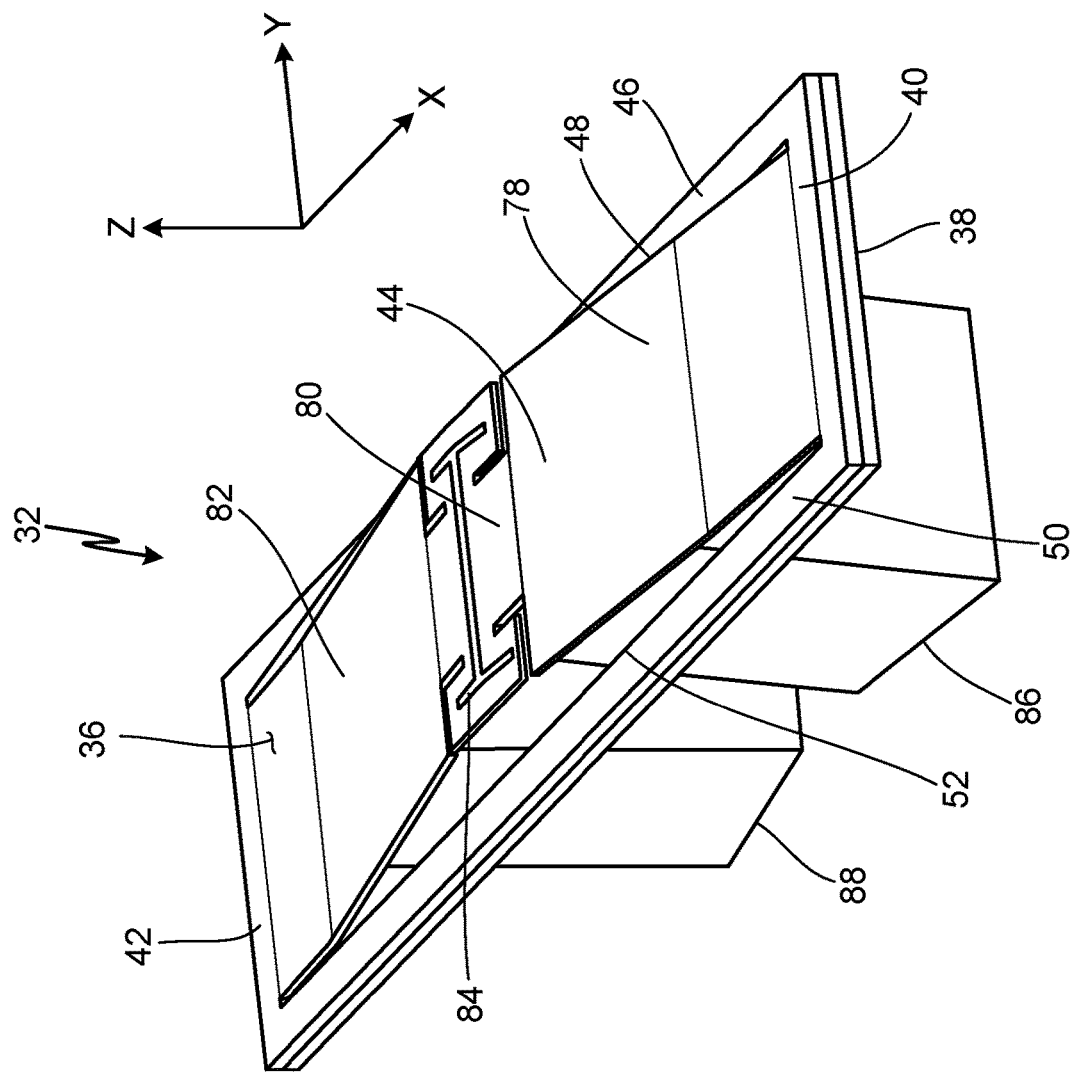
FIG. 6B is a perspective view of the MEMS device under flexion.

FIG. 6A is a perspective view of MEMS device 32 in a relaxed state. FIG. 6B is a perspective view of MEMS device 32 under flexion. FIGS. 6A and 6B will be discussed together. MEMS device 32 includes top layer 36, bottom layer 38, first mooring portion 40, second mooring portion 42, MEMS device body 44, first margin 46, first slot 48, second margin 50, and second slot 52. MEMS device body 44 includes first cantilever 78, pivot spring 80, second cantilever 82, circuitous cuts 84, first proof mass 86, and second proof mass 88.

MEMS device 32 is discussed above in reference to FIGS. 4 and 5. MEMS device body 44 is between first mooring portion 40, second mooring portion 42, first margin 46, and second margin 50. First slot 48 is between MEMS device body 44 and first margin 46 running from first mooring portion 40 to second mooring portion 42. Second slot 52 is between first margin 50 and MEMS device body 44 running from first mooring portion 40 to second mooring portion 42. MEMS device body 44 includes first cantilever 78, pivot spring 80, and second cantilever 82. MEMS device body 44 attaches to first mooring portion 40 and second mooring portion 42 of MEMS device 32 by first cantilever 78 and second cantilever 82, respectively. Pivot spring 80 is between first cantilever 78 and second cantilever 82. Pivot spring 80 includes circuitous cuts 84 extending through top layer 36 and bottom layer 38. First proof mass 86 attaches to a bottom of bottom layer 38 of first cantilever 78. Second proof mass 88 attaches to a bottom of bottom layer 38 of second cantilever 82. MEMS device 32 lies in an x-y-z-plane where the MEMS device body 44 is significantly in the x-y-plane when in the relaxed state, first margin 46 runs alongside the x-axis, and first mooring portion 40 runs alongside the y-axis.

Upon vibration in the z-direction, MEMS device body 44 will vibrate in the z-direction. FIG. 6B demonstrates how first cantilever 78 and second cantilever 82 bend together when connected by pivot spring 80 in response to force in the z-direction. This bending in the same direction causes mechanical stress in the piezoelectric material of top layer 36 of MEMS device 32. First mooring portion 40, second mooring portion 42, first margin 46, and second margin 50 all stay in place allowing MEMS device 32 to attach to a stable structure while MEMS device body 44 vibrates. First slot 48 and second slot 52 allow MEMS device body 44 to vibrate freely from first margin 46 and second margin 50.

Connecting first cantilever 78 and second cantilever 82 with pivot spring 80 causes first cantilever 78 and second cantilever 82 to move in-phase. In-phase movement allows for the electrical signal in first cantilever 78 and second cantilever 82 to be the same sign. Pivot spring 80 eliminates the opposite charge at an inflection point of MEMS device body 44 during vibration and lowers signal loss in MEMS device 32. Connecting first cantilever 78 with second cantilever 82 limits the z-direction movement in MEMS device 32 and lowers the occurrence of breakage. MEMS device 32 allows for limited net charge of parasitic rocking vibrations along the x-axis because stretching motion from first cantilever 78 will be cancelled from compressive motion in second cantilever 82. Further, twisting motions caused by y-direction forces are lowered because first cantilever 78 and second cantilever 82 move symmetrically. This symmetrical motion will induce both tensile and compressive stress equally in both first cantilever 78 and second cantilever 82 so the net electric charge generated by each MEMS device 32 will be zero. First slot 48 and second slot 52 allow for MEMS device body 44 to move independently of first margin 46 and second margin 50. This allows MEMS device 32 to be solidly anchored while MEMS device body 44 moves in response to vibrations.

Figure 7:
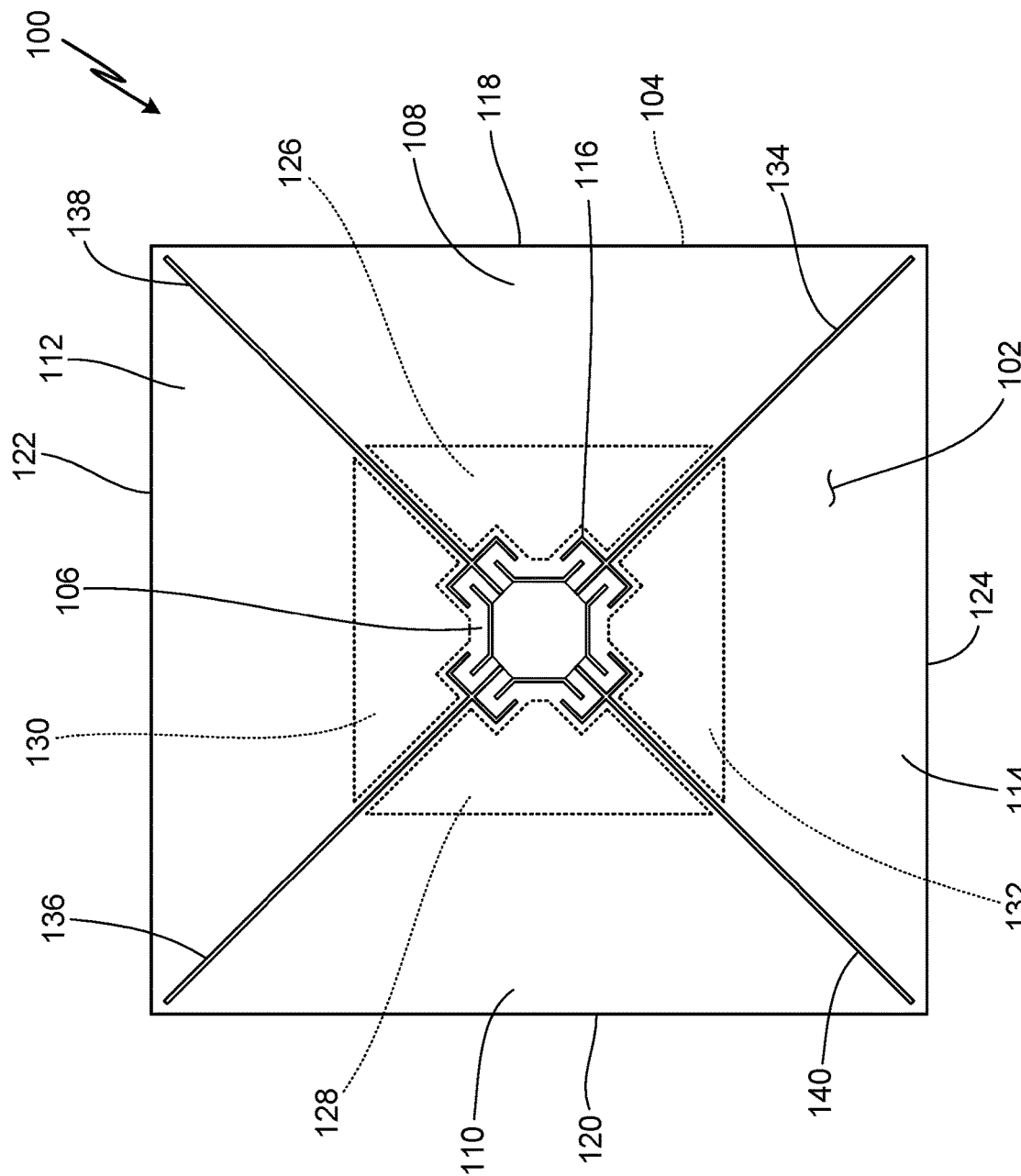
FIG. 7 is a top view of an alternate embodiment of a MEMS device including a system of four cantilevers connected with a spring.

FIG. 7 is a top view of an alternate embodiment of MEMS device 100 including pivot spring 106 connecting first cantilever 108, second cantilever 110, third cantilever 112, and fourth cantilever 114. MEMS device 100 includes top layer 102, bottom layer 104, pivot spring 106, first cantilever 108, second cantilever 110, third cantilever 112, fourth cantilever 114, and circuitous cuts 116. MEMS device 100 further includes first mooring portion 118, second mooring portion 120, third mooring portion 122, fourth mooring portion 124, first proof mass 126, second proof mass 128, third proof mass 130, fourth proof mass 132, first cut 134, second cut 136, third cut 138, and third cut 140.

MEMS device 100 is manufactured as a single piece. Top layer 102 is a first layer made of a piezoelectric material, such as aluminum nitride or PZT. Bottom layer 104 is a second layer made of a substrate material, such as surface-doped silicon. Bottom layer 104 is stiffer than top layer 102. Pivot spring 106 is located at a center of MEMS device 100 and connects first cantilever 108, second cantilever 110, third cantilever 112, and fourth cantilever 114. Circuitous cuts 116 in pivot spring 106 extend through top layer 102 and bottom layer 104.

First cantilever 108, second cantilever 110, third cantilever 112, and fourth cantilever 114 are in operable communication with pivot spring 106. Each of first cantilever 108, second cantilever 110, third cantilever 112, and fourth cantilever 114 have a trapezoidal shape. First cantilever 108 is across from second cantilever 110. Third cantilever 112 is positioned between first cantilever 108 and second cantilever 110. Fourth cantilever 114 is across from third cantilever 112 and positioned between first cantilever 108 and second cantilever 110. First cantilever 108 is connected to first mooring portion 118. Second cantilever 110 is connected to second mooring portion 120. Third cantilever 112 is connected to third mooring portion 122. Fourth cantilever 114 is connected to fourth mooring portion 124. MEMS device 100 can attach to support frame 34 shown in FIG. 2 by first mooring portion 118 attaching to first attachment site 68, second mooring portion 120 attaching to second attachment site 70, third mooring portion 122 attaching to third attachment site 72, and fourth mooring portion 124 attaching to fourth attachment site 74. First proof mass 126 is connected to a bottom of bottom layer 104 of first cantilever 108. Second proof mass 128 is connected to a bottom of bottom layer 104 of second cantilever 110. Third proof mass 130 is connected to a bottom of bottom layer 104 of third cantilever 112. Fourth proof mass 132 is connected to a bottom of bottom layer 104 of fourth cantilever 114. First cut 134 is between first cantilever 108 and fourth cantilever 114. Second cut 136 is between second cantilever 110 and third cantilever 112. Third cut 138 is between third cantilever 112 and first cantilever 108. Fourth cut 140 is between fourth cantilever 114 and second cantilever 110. First cut 134, second cut 136, third cut 138, and fourth cut 140 extend through top layer 102 and bottom layer 104.

When MEMS device 100 senses vibration, first cantilever 108, second cantilever 110, third cantilever 112, and fourth cantilever 114 move together because of pivot spring 106. The piezoelectric material of top layer 102 of MEMS device 100 creates charge due to the mechanical movements. First proof mass 126, second proof mass 128, third proof mass 130, and fourth proof mass 132 can be adjusted to tune MEMS device 100 to detect a certain resonant frequency. MEMS device 100 can also be tuned to a specific resonance frequency depending on the stiffness of bottom layer 104. First cut 134, second cut 136, third cut 138, and fourth cut 140 allow first cantilever 108, second cantilever 110, third cantilever 112, and fourth cantilever 114 to move independently.

The trapezoidal shape of first cantilever 108, second cantilever 110, third cantilever 112, and fourth cantilever 114 of MEMS device 100 allows for maximized piezoelectric bending area on top layer 102. The trapezoidal shape also minimizes the area occupied by pivot spring 106. Linking first cantilever 108, second cantilever 110, third cantilever 112, and fourth cantilever 114 by pivot spring 106 allows MEMS device 100 to move in a synchronized fashion that allows for the electrical signal to be additive across the whole surface. Further, parasitic vibrational mode sensing is minimized by a four-cantilever system because pivot spring 106 forces the system of cantilevers to operate in phase and reduces secondary vibrational modes as discussed regarding FIG. 4 and FIG. 5. Pivot spring 106 limits the movement of MEMS device 100 and lowers the occurrence of breakage. Circuitous cuts 116 in pivot spring 106 define the stiffness in pivot spring 106 and reduce the size of pivot spring 106.

Discussion of Possible Embodiments

The following are non-exclusive descriptions of possible embodiments of the present invention.

A MEMS device includes a first layer and a second layer connected to the first layer. The MEMS device further includes a first mooring and a second mooring portion. The MEMS device further includes a MEMS device body connected to the first mooring portion and the second mooring portion. The MEMS device body includes a first cantilever attached to the first mooring portion, a second cantilever attached to the second mooring portion, and a spring in operable communication with the first cantilever and the second cantilever.

The MEMS device of the preceding paragraph can optionally include, additionally and/or alternatively, any one or more of the following features, configurations and/or additional components:

Wherein the MEMS device is manufactured as a single piece, the first layer being a piezoelectric material and the second layer being a substrate material.

The MEMS device further includes a first margin alongside the MEMS device body attached to both the first mooring portion and the second mooring portion, a first slot between the first margin and the MEMS device body, a second margin alongside the MEMS device body opposite the first margin and attached to both the first mooring portion and the second mooring portion, and a second slot between the second margin and the MEMS device body.

The MEMS device further includes a first proof mass connected to a bottom of the second layer of the first cantilever and a second proof mass connected to a bottom of the second layer of the second cantilever.

Wherein the first proof mass is equivalent to a first mass of the first cantilever, and the second proof mass is equivalent to a second mass of the second cantilever.

Wherein the spring further includes a set of cuts extending through the first layer and the second layer of the spring.

Wherein the set of cuts are cut in a circuitous pattern.

A transducer includes a support frame. The support frame includes a support wafer; a bonding material with a height H; a first sidewall attached to the support wafer by a bonding material; a second sidewall across from the first sidewall and attached to the support wafer by the bonding material; a third sidewall adjacent to the first sidewall and the second sidewall and attached to the support wafer by the bonding material; a fourth sidewall across from the third sidewall and adjacent to the first sidewall and the second sidewall and attached to the support wafer by the bonding material; and a cavity formed in the support frame created by the first sidewall, the second sidewall, the third sidewall, the fourth sidewall, and the support wafer. The transducer further includes a MEMS device supported by the support frame and suspended over the cavity. The MEMS device further includes a first layer, a second layer connected to the first layer, a first mooring portion, a second mooring portion, and a MEMS device body. The MEMS device body connects to the first mooring portion and the second mooring portion. The MEMS device body includes a first cantilever attached to the first mooring portion, a second cantilever attached to the second mooring portion, and a spring in operable communication with the first cantilever and the second cantilever.

The transducer of the preceding paragraph can optionally include, additionally and/or alternatively, any one or more of the following features, configurations and/or additional components:

The transducer further includes a first attachment site at a top of the first sidewall to which the first cantilever is mechanically attached, a second attachment site at a top of the second sidewall to which the second cantilever is mechanically attached, a third attachment site at a top of the third sidewall, and a fourth attachment site at a top of the fourth sidewall.

Wherein MEMS device further includes a first margin alongside the MEMS device body, wherein the first margin extends from the first mooring portion to the second mooring portion, and wherein the first margin is connected to the third sidewall at the third attachment site; a first slot between the first margin and MEMS device body; a second margin alongside the MEMS device body opposite the first margin, wherein the second margin extends from the first mooring portion to the second mooring portion, and wherein the second margin connects to the fourth sidewall at the fourth attachment site; and a second slot between the second margin and the MEMS device body.

The transducer further includes a first proof mass connected to a bottom of the second layer of the first cantilever, and a second proof mass connected to a bottom of the second layer of the second cantilever.

Wherein the first proof mass is equivalent to a first mass of the first cantilever, and the second proof mass is equivalent to a second mass of the second cantilever.

Wherein the spring further includes a set of cuts extending through the first layer and the second layer of the spring.

Wherein the set of cuts through the spring are cut in a circuitous pattern.

Wherein the MEMS device further includes a third mooring portion, a fourth mooring portion, a third cantilever positioned between the first cantilever and the second cantilever and attached to the third mooring portion, and a fourth cantilever positioned between the first cantilever and the second cantilever opposite of the third cantilever and attached to the fourth mooring portion wherein the spring is in operable communication with the first cantilever, the second cantilever, the third cantilever, and the fourth cantilever.

Wherein the support frame further includes a first attachment site at a top of the first sidewall, wherein the first cantilever is mechanically and electrically attached, a second attachment site at a top of the second sidewall wherein the second cantilever is mechanically and electrically attached, a third attachment site at a top of the third sidewall wherein the third cantilever is mechanically and electrically attached, and a fourth attachment site at a top of the fourth sidewall wherein the fourth cantilever is mechanically and electrically attached.

The transducer further includes a first proof mass attached to a bottom of the second layer of the first cantilever, a second proof mass attached to a bottom of the second layer of the second cantilever, a third proof mass attached to a bottom of the second layer of the third cantilever, and a fourth proof mass attached to a bottom of the second layer of the fourth cantilever.

Wherein the first proof mass is equivalent to a first mass of the first cantilever, the second proof mass is equivalent to a second mass of the second cantilever, the third proof mass is equivalent to a third mass of the third cantilever, and the fourth proof mass is equivalent to a fourth mass of the fourth cantilever.

The transducer further comprises a set of cuts extending through the first layer and the second layer with a first cut between the first cantilever and the fourth cantilever, a second cut between the second cantilever and the third cantilever, a third cut between the third cantilever and the first cantilever, and a fourth cut between the fourth cantilever and the second cantilever.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A microelectromechanical systems (MEMS) device comprising:
   a first layer;
   a second layer connected to the first layer;
   a first mooring portion;

a second mooring portion; and
a MEMS device body connected to the first mooring portion and the second mooring portion, comprising:
a first cantilever attached to the first mooring portion;
a second cantilever attached to the second mooring portion; and
a spring in operable communication with the first cantilever and the second cantilever, wherein the spring comprises a set of cuts extending through the first layer and the second layer of the spring.

2. The MEMS device of claim 1, wherein the MEMS device is manufactured as a single piece, the first layer being a piezoelectric material and the second layer being a substrate material.

3. The MEMS device of claim 1, and further comprising:
a first margin alongside the MEMS device body attached to both the first mooring portion and the second mooring portion;
a first slot between the first margin and the MEMS device body;
a second margin alongside the MEMS device body opposite the first margin and attached to both the first mooring portion and the second mooring portion; and
a second slot between the second margin and the MEMS device body.

4. The MEMS device of claim 1, and further comprising:
a first proof mass connected to a bottom of the second layer of the first cantilever; and
a second proof mass connected to a bottom of the second layer of the second cantilever.

5. The MEMS device of claim 4, wherein the first proof mass is equivalent to a first mass of the first cantilever, and the second proof mass is equivalent to a second mass of the second cantilever.

6. The MEMS device of claim 1, wherein the set of cuts are cut in a circuitous pattern.

7. A transducer comprising:
a support frame comprises:
a support wafer;
a bonding material with a height H;
a first sidewall attached to the support wafer by the bonding material;
a second sidewall across from the first sidewall attached to the support wafer by the bonding material;
a third sidewall adjacent to the first sidewall and the second sidewall and attached to the support wafer by the bonding material;
a fourth sidewall across from the third sidewall and adjacent to the first sidewall and the second sidewall and attached to the support wafer by the bonding material; and
a cavity formed in the support frame created by the first sidewall, the second sidewall, the third sidewall, the fourth sidewall, and the support wafer; and
a microelectromechanical systems (MEMS) device supported by the support frame and suspended over the cavity, the MEMS device comprises:
a first layer;
a second layer connected to the first layer;
a first mooring portion;
a second mooring portion; and
a MEMS device body connected to the first mooring portion and the second mooring portion, comprising:
a first cantilever attached to the first mooring portion;
a second cantilever attached to the second mooring portion; and
a spring in operable communication with the first cantilever and the second cantilever, wherein the spring comprises a set of cuts extending through the first layer and the second layer of the spring.

8. The transducer of claim 7, and further comprising:
the support frame further comprises:
a first attachment site at a top of the first sidewall to which the first cantilever is mechanically attached;
a second attachment site at a top of the second sidewall to which the second cantilever is mechanically attached;
a third attachment site at a top of the third sidewall; and
a fourth attachment site at a top of the fourth sidewall.

9. The transducer of claim 8, wherein the MEMS device further comprises:
a first margin alongside the MEMS device body, wherein the first margin extends from the first mooring portion to the second mooring portion, and wherein the first margin is connected to the third sidewall at the third attachment site;
a first slot between the first margin and MEMS device body;
a second margin alongside the MEMS device body opposite the first margin, wherein the second margin extends from the first mooring portion to the second mooring portion, and wherein the second margin connects to the fourth sidewall at the fourth attachment site; and
a second slot between the second margin and the MEMS device body.

10. The transducer of claim 7, and further comprising:
a first proof mass connected to a bottom of the second layer of the first cantilever; and
a second proof mass connected to a bottom of the second layer of the second cantilever.

11. The transducer of claim 10, wherein the first proof mass is equivalent to a first mass of the first cantilever, and the second proof mass is equivalent to a second mass of the second cantilever.

12. The transducer of claim 7, wherein the set of cuts through the spring are cut in a circuitous pattern.

13. The transducer of claim 7, and further comprising a gap space defined by the bottom of the second layer and the support wafer, wherein the gap space is equivalent to height H.

14. A transducer comprising:
a support frame comprises:
a support wafer;
a bonding material with a height H;
a first sidewall attached to the support wafer by the bonding material;
a second sidewall across from the first sidewall attached to the support wafer by the bonding material;
a third sidewall adjacent to the first sidewall and the second sidewall and attached to the support wafer by the bonding material;
a fourth sidewall across from the third sidewall and adjacent to the first sidewall and the second sidewall and attached to the support wafer by the bonding material; and
a cavity formed in the support frame created by the first sidewall, the second sidewall, the third sidewall, the fourth sidewall, and the support wafer; and
a microelectromechanical systems (MEMS) device supported by the support frame and suspended over the cavity, the MEMS device comprises:

a first layer;
a second layer connected to the first layer;
a first mooring portion;
a second mooring portion;
a third mooring portion;
a fourth mooring portion;
a MEMS device body connected to the first mooring portion, the second mooring portion, the third mooring portion, and the fourth mooring portion, the MEMS device body comprising:
a first cantilever attached to the first mooring portion;
a second cantilever attached to the second mooring portion;
a third cantilever positioned between the first cantilever and the second cantilever and attached to the third mooring portion; and
a fourth cantilever positioned between the first cantilever and the second cantilever opposite of the third cantilever and attached to the fourth mooring portion; and
a spring in operable communication with the first cantilever, the second cantilever, the third cantilever, and the fourth cantilever.

15. The transducer of claim 14, wherein the support frame further comprises:
a first attachment site at a top of the first sidewall, wherein the first cantilever is mechanically and electrically attached;
a second attachment site at a top of the second sidewall wherein the second cantilever is mechanically and electrically attached;
a third attachment site at a top of the third sidewall wherein the third cantilever is mechanically and electrically attached; and
a fourth attachment site at a top of the fourth sidewall wherein the fourth cantilever is mechanically and electrically attached.

16. The transducer of claim 14, and further comprising:
a first proof mass attached to a bottom of the second layer of the first cantilever;
a second proof mass attached to a bottom of the second layer of the second cantilever;
a third proof mass attached to a bottom of the second layer of the third cantilever; and
a fourth proof mass attached to a bottom of the second layer of the fourth cantilever.

17. The transducer of claim 16, wherein the first proof mass is equivalent to a first mass of the first cantilever, the second proof mass is equivalent to a second mass of the second cantilever, the third proof mass is equivalent to a third mass of the third cantilever, and the fourth proof mass is equivalent to a fourth mass of the fourth cantilever.

18. The transducer of claim 14, and further comprising a set of cuts extending through the first layer and the second layer with a first cut between the first cantilever and the fourth cantilever, a second cut between the second cantilever and the third cantilever, a third cut between the third cantilever and the first cantilever, and a fourth cut between the fourth cantilever and the second cantilever.

\* \* \* \* \*